(12) United States Patent
Yamamoto

(10) Patent No.: US 11,264,293 B2
(45) Date of Patent: Mar. 1, 2022

(54) WIRING BOARD, ELECTRONIC DEVICE PACKAGE, AND ELECTRONIC DEVICE

(71) Applicant: KYOCERA Corporation, Kyoto (JP)

(72) Inventor: Makoto Yamamoto, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/634,021

(22) PCT Filed: May 18, 2018

(86) PCT No.: PCT/JP2018/019377
§ 371 (c)(1),
(2) Date: Jan. 24, 2020

(87) PCT Pub. No.: WO2019/021598
PCT Pub. Date: Jan. 31, 2019

(65) Prior Publication Data
US 2021/0090963 A1    Mar. 25, 2021

(30) Foreign Application Priority Data
Jul. 24, 2017  (JP) .............................. JP2017-142478

(51) Int. Cl.
*H01L 23/08*    (2006.01)
*H01L 23/498*   (2006.01)
*H05K 1/03*     (2006.01)

(52) U.S. Cl.
CPC ........ *H01L 23/08* (2013.01); *H01L 23/49822* (2013.01); *H05K 1/03* (2013.01)

(58) Field of Classification Search
CPC ........ C04B 2237/062; C04B 2237/343; C04B 2237/403; C04B 2237/404;
(Continued)

(56) References Cited

U.S. PATENT DOCUMENTS 5,514,451 A * 5/1996 Kumar ................... C09D 11/52
                                                          428/210
9,105,953 B2 * 8/2015 Gomi ...................... H01P 5/107
(Continued)

FOREIGN PATENT DOCUMENTS

EP    3118895 A1    1/2017
JP    05-152463 A   6/1993
(Continued)

*Primary Examiner* — Timothy J Thompson
*Assistant Examiner* — Guillermo J Egoavil
(74) *Attorney, Agent, or Firm* — Volpe Koenig

(57) ABSTRACT

A wiring board includes an insulating substrate and a wiring conductor. The insulating substrate includes a first layer having an upper surface and a lower surface and having a first content of aluminum oxide and containing mullite and a second layer stacked on the upper surface and/or the lower surface of the first layer and having a second content of aluminum oxide greater than the first content. The wiring conductor is located inside the first layer and contains a manganese compound and/or a molybdenum compound. A manganese silicate phase and/or a magnesium silicate phase in an interface area between the insulating substrate and the wiring conductor.

14 Claims, 8 Drawing Sheets

(58) Field of Classification Search
CPC ............ C04B 2237/58; C04B 2237/68; C04B 2237/86; B32B 18/00; H01L 23/08; H01L 23/15; H01L 23/49822; H01L 23/49866; H01L 23/498; H05K 1/0271; H05K 1/03; H05K 1/0306; H05K 3/4629; H05K 2201/068; H05K 2203/1131
USPC ........ 174/251, 260, 264; 257/738, 701, 773; 361/760, 792, 794; 343/905
See application file for complete search history.

(56) References Cited

U.S. PATENT DOCUMENTS

| | | | |
|---|---|---|---|
| 2003/0034554 A1 | 2/2003 | Onitani et al. | |
| 2004/0155723 A1* | 8/2004 | Koriyama | H01P 5/107 |
| | | | 333/26 |
| 2015/0251216 A1* | 9/2015 | Park | B05D 3/102 |
| | | | 427/292 |
| 2017/0069556 A1* | 3/2017 | Kawazu | H01L 23/057 |
| 2018/0123210 A1* | 5/2018 | Nishihara | H01P 3/081 |

FOREIGN PATENT DOCUMENTS

| | | | | |
|---|---|---|---|---|
| JP | 05152463 A | * | 6/1993 | ............ H01L 23/08 |
| WO | WO-2017122820 A1 | * | 7/2017 | ............ B32B 15/14 |

* cited by examiner

WIRING BOARD, ELECTRONIC DEVICE PACKAGE, AND ELECTRONIC DEVICE

FIELD

The present invention relates to a wiring board including an insulating substrate containing mullite and a wiring conductor located on the insulating substrate, an electronic device package, and an electronic device.

BACKGROUND

A known board for mounting an electronic component includes an insulating substrate formed from an insulating material such as sintered aluminum oxide, and a metallized layer located on a surface of the insulating substrate. The metallized layer serves as a conductive path for electrical connection between the electronic component and an external electric circuit. To improve signal transmission or other characteristics, an insulating material containing mullite or an insulating material containing mullite and alumina (aluminum oxide) may be used for an electronic device including an electronic component mounted on a wiring board or in an electronic component housing package.

For better external heat dissipation from an electronic component such as an optical semiconductor device, for example, an electronic component housing package may typically include a metal housing and the substrate described above bonded to the metal housing as an input-output unit.

BRIEF SUMMARY

A wiring board according to one aspect of the present invention includes an insulating substrate including a first layer having an upper surface and a lower surface and having a first content of aluminum oxide and containing mullite and a second layer stacked on the upper surface and/or the lower surface of the first layer and having a second content of aluminum oxide greater than the first content, a wiring conductor located inside the first layer and containing a manganese compound and/or a molybdenum compound, and a manganese silicate phase and/or a magnesium silicate phase in an interface area between the insulating substrate and the wiring conductor.

An electronic device package according to another aspect of the present invention includes the wiring board with the above structure, and a metal housing having a recess and an opening in a side wall of the recess. The wiring board is bonded to the metal housing to close the opening.

An electronic device according to still another aspect of the present invention includes the electronic device package with the above structure, and an electronic component received in the recess in the metal housing.

DETAILED DESCRIPTION

A wiring board, an electronic device package, and an electronic device according to embodiments of the present invention will now be described with reference to the accompanying drawings. The upward and downward directions are hereafter used for descriptive purposes, and do not limit the directions in actual use of the wiring board, the electronic device package, and the electronic device.

Figure 1:
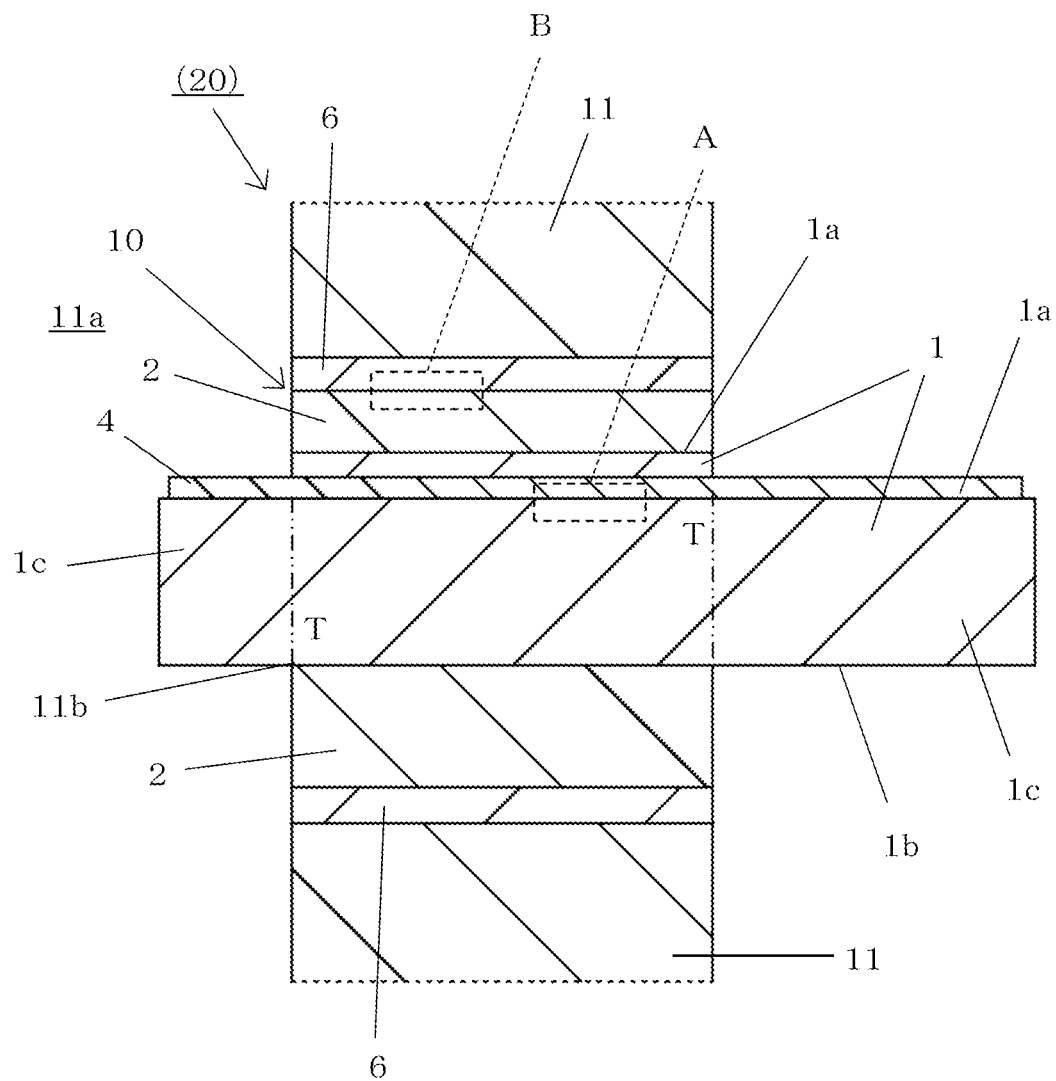
FIG. 1 is a cross-sectional view of an example wiring board according to one embodiment of the present invention.
Figure 2:
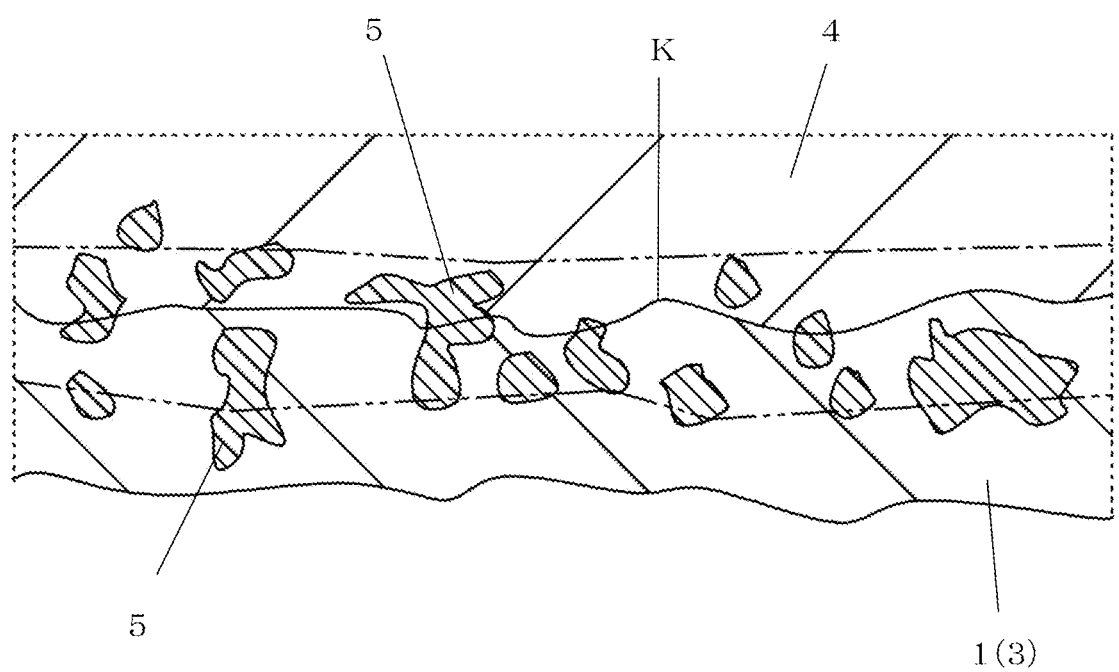
FIG. 2 is a schematically enlarged cross-sectional view of part A in FIG. 1.
Figure 3:
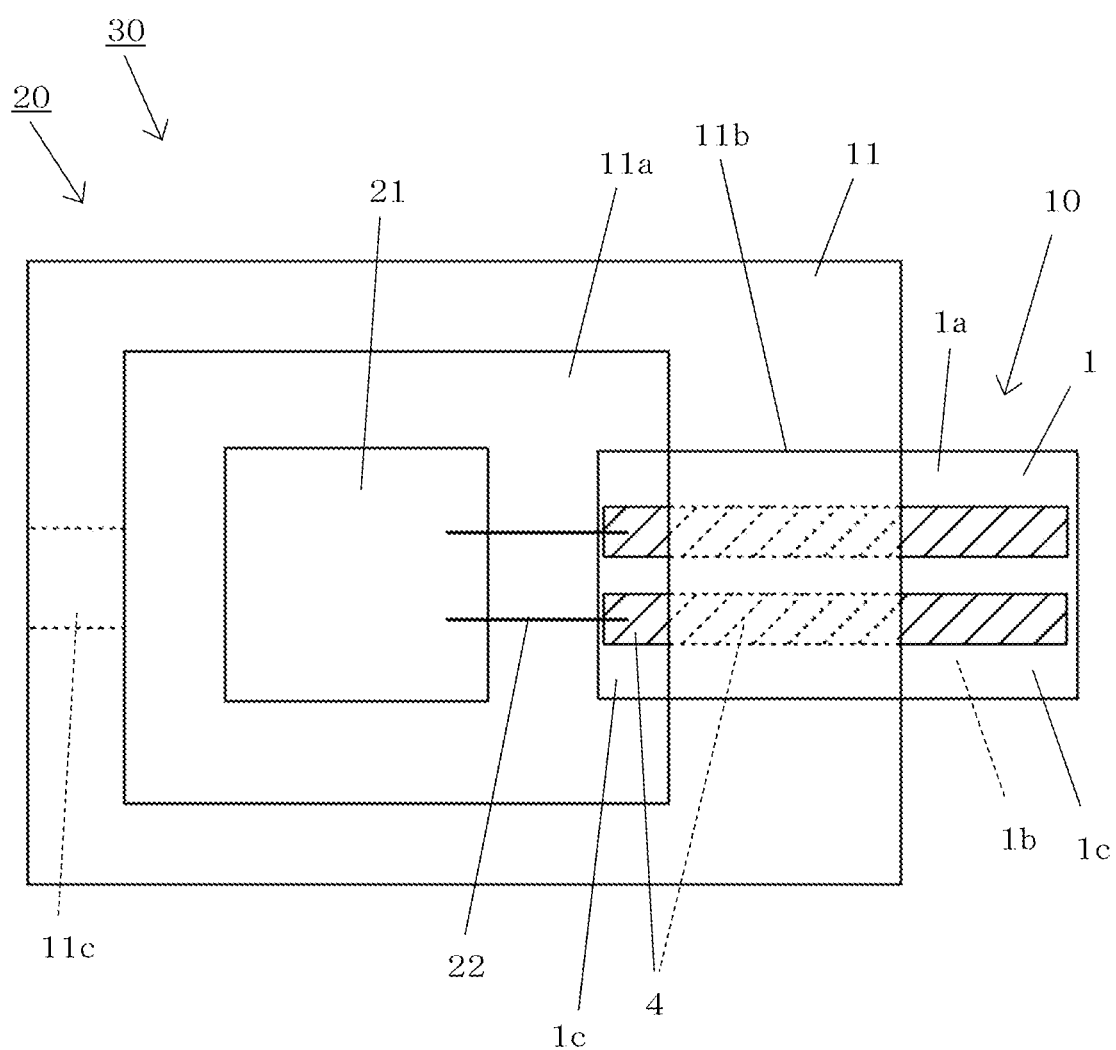
FIG. 3 is a plan view of the wiring board and an example electronic device package according to the embodiment of the present invention.
Figure 4:
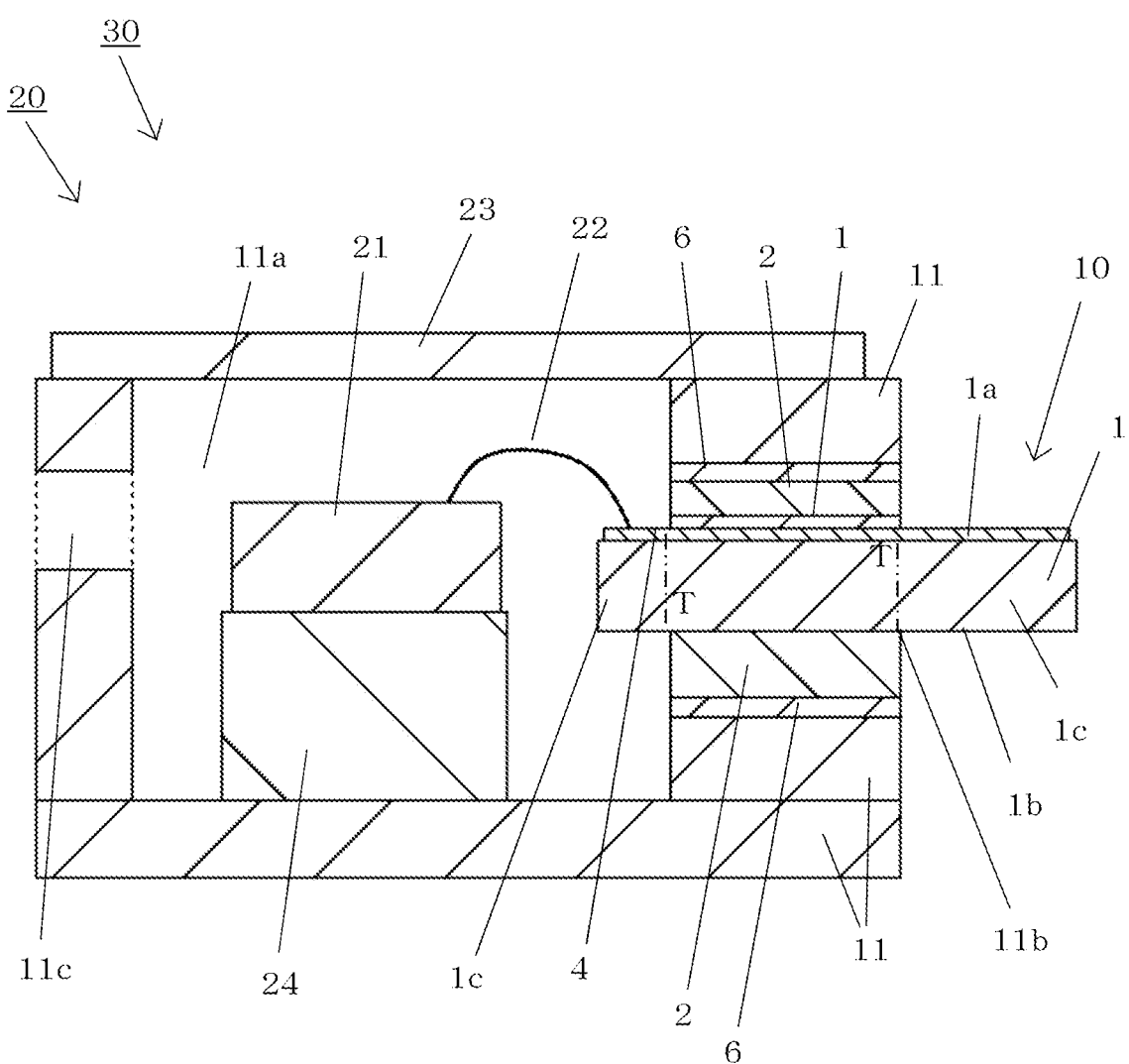
FIG. 4 is a cross-sectional view of an example electronic device according to the embodiment of the present invention.

FIG. 1 is a cross-sectional view of an example wiring board according to one embodiment of the present invention. FIG. 2 is a schematically enlarged cross-sectional view of part A in FIG. 1. FIG. 3 is a plan view of the wiring board and an example electronic device package according to the embodiment of the present invention. FIG. 4 is a cross-sectional view of an example electronic device according to the embodiment of the present invention.

A wiring board 10 according to the embodiment basically includes an insulating substrate 3 including a first layer 1 and a second layer 2 stacked on each other, and a wiring conductor 4 located inside the first layer 1. An electronic device package 20 according to the embodiment basically includes the wiring board 10 and a metal housing 11 including a recess 11a in which the wiring board 10 is joined. An electronic device 30 basically includes the electronic device package 20 and an electronic component 21 received in the recess 11a in the metal housing 11. The electronic component 21 received in the recess 11a is electrically connected to the wiring board 10, and further to an external electric circuit through the wiring board 10. This electrical connection allows transmission and reception of signals between the electronic component 21 and the external electric circuit. Signals to be transmitted have frequencies of, for example, about 40 GHz or more. For an electronic component 21 for optical communications, signals have frequencies of, for example, about 60 GHz (56 to 64 GHz).

Wiring Board

The insulating substrate 3 included in the wiring board 10 is, for example, rectangular in a plan view. The insulating substrate 3 includes the first layer 1 having an upper surface 1a and a lower surface 1b, and the second layer 2 stacked on at least either the upper surface 1a or the lower surface 1b of the first layer 1. In the examples shown in FIGS. 1 to 4, the second layer 2 is stacked on each of the upper surface 1a and the lower surface 1b of the first layer 1. In the illustrated examples, each second layer 2 is smaller than the upper surface 1a and the lower surface 1b of the first layer 1 in a plan view. More specifically, the second layer 2 is stacked on a part of the upper surface 1a or on a part of the lower surface 1b of the first layer 1. The upper surface 1a of the first layer 1 is stepped, and includes an upper step and a lower step. The second layer 2 is stacked on the upper step. In other words, the first layer 1 has partly varying thicknesses (distances between the upper surface 1a and the lower surface 1b).

The insulating substrate 3 serves as a base to receive wiring conductors 4 as conductive paths for electrically connecting the electronic component 21 to an external electric circuit. The insulating substrate 3 also serves as an insulator for electrically insulating the multiple (two in the example shown in FIG. 3) wiring conductors 4 from each other. As shown in FIG. 1 and other figures, the wiring conductors 4 are located inside the first layer 1. In the example according to the embodiment including the first layer 1 with partly varying thicknesses as described above, the wiring conductors 4 are located inside a thicker portion of the first layer 1 and are exposed on the upper surface 1a of a thinner portion of the first layer 1.

The first layer 1 included in the insulating substrate 3 has a first content of aluminum oxide, and further contains mullite. The second layer 2 has a second content of aluminum oxide greater than the first content. In other words, the first layer 1 and the second layer 2 each containing aluminum oxide are stacked on each other to form the insulating substrate 3 containing an aluminum oxide as a main constituent.

The first content is, for example, about 10 to 90% by mass of aluminum oxide (hereafter also alumina). The second content is, for example, about 40 to 99.5% by mass of aluminum oxide and is larger than the first content. In this case, the first layer 1 with an alumina content of 90% or less by mass can have a relative dielectric constant of about 9 or less. This structure effectively reduces delays in high-frequency signal transmission through the wiring conductors 4. The second layer 2 with an alumina content of about 40% or greater by mass can have a higher mechanical strength of about 400 MPa or greater (measured by a three☐ point bending test described later). The first layer 1 with an alumina content of about 10% or greater by mass can have an appropriate mechanical strength of the first layer 1 and an appropriate bonding strength between the first layer 1 and the second layer 2. The second layer 2 with an alumina content of about 99.5% or less, or in other words, the second layer 2 containing a sintering aid, such as silica, can facilitate sintering.

As described above, the second layer 2 may be formed from sintered aluminum oxide simply containing alumina and a sintering aid (additive), such as silica (silicon oxide). Mullite has a relative dielectric constant of about 6.5 to 7.0. Alumina has a relative dielectric constant of about 9 to 10. The first layer 1 may thus have a relative dielectric constant of about 6.9 to 8.8, whereas the second layer 2 may have a relative dielectric constant of about 7.4 to 10.

The first layer 1 contains alumina, in addition to mullite. Alumina has a higher mechanical strength than mullite. For example, alumina has a strength of about 400 to 620 MPa and mullite has a strength of about 200 to 300 MPa, as measured by a three-point bending test for measuring flexural strength in accordance with JISR1601-1995. The first layer 1 and the insulating substrate 3 including the first layer 1 can thus have a higher mechanical strength than an insulating substrate 3 entirely formed from sintered mullite contained in the first layer 1.

In the wiring board 10 according to the embodiment, the second layer 2 is not located on a part of the upper surface 1a of the first layer 1 on which the wiring conductors 4 are located. More specifically, the wiring conductors 4 excluding their portions located inside the first layer 1 are adjacent to a ceramic material containing mullite and exposed outside (to air). As described above, the first layer 1 has a relatively smaller relative dielectric constant. Thus, the portions of the wiring conductors 4 located inside the first layer 1 can reduce delays in high-frequency signal transmission. For example, for signals with a frequency of about 40 GHz, the wiring conductors 4 reduce transmission delays by about 10% per unit length (e.g., 1 mm), as compared with wiring conductors 4 having the upper or lower surface in contact with the second layer 2 formed from sintered aluminum oxide.

The second layer 2 has a relatively higher content of alumina having a higher mechanical strength as described above. The second layer 2 can thus effectively increase the mechanical strength of the insulating substrate 3. The insulating substrate 3 thus easily reduces delays in high-frequency signal transmission through the wiring conductors 4 and easily improves the mechanical strength. The wiring board 10 can thus have improved transmission characteristics of high-frequency signals as well as high mechanical strength.

The first layer 1 in the insulating substrate 3 can be prepared by, for example, the processes described below. An aluminum oxide-containing powdery raw material and a mullite-containing powdery raw material are kneaded with an appropriate additive, an organic binder, and an organic solvent to prepare slurry. The slurry is then shaped into sheets using, for example, a doctor blade and cut into multiple rectangular ceramic green sheets with a predetermined size. The ceramic green sheets are then stacked into a laminate. The laminate is then fired at a temperature of about 1350 to 1450° C. to prepare the first layer 1. The second layer 2 is also prepared in the same manner as the first layer 1, except that the prepared slurry has a greater aluminum oxide content than the slurry for the first layer 1.

The insulating substrate 3 including the first layer 1 and the second layer 2 can be fabricated by bonding the first layer 1 and the second layer 2 prepared as described above with a bond such as glass. The insulating substrate 3 may also be fabricated by stacking a ceramic green sheet to be the first layer 1 and a ceramic green sheet to be the second layer 2 into a laminate and then collectively firing the laminate. In this case, the first layer 1 and the second layer 2 are co-fired and firmly bonded together. This effectively increases the mechanical strength of the insulating substrate 3. Such collective firing is possible both with the material having no mullite content (0%) and with the material having a mullite content of 85% by mass.

The wiring conductors 4 in the wiring board 10 according to the embodiment contain at least either a manganese compound or a molybdenum compound. The wiring conductors 4 are located inside the first layer 1. The wiring board 10 has at least either manganese silicate phases or magnesium silicate phases in interface areas between the insulating substrate 3 and the wiring conductors 4, or more specifically, between the first layer 1 and the wiring conductors 4. The manganese silicate phases and the magnesium silicate phases may hereafter be simply referred to as silicate phases 5 without being distinguished from each other.

FIG. 2 is an enlarged cross-sectional view of an interface area between the insulating substrate 3 (first layer 1) and the wiring conductor 4. The silicate phases 5 each have an irregular shape, one example of which is schematically shown in FIG. 2. For example, the interface area is defined between upper and lower imaginary lines (two-dot chain lines) and includes a boundary K between the first layer 1 and the wiring conductor 4 in FIG. 2. This area includes multiple silicate phases 5 in a dispersed manner.

The silicate phases 5 include, for example, polycrystalline particles such as particles of manganese silicate or magnesium silicate with irregular shapes as shown in FIG. 2. The particles of the silicate phases 5 each have an irregular surface with complex projections and depressions. In this case, the silicate phases 5 may have larger bonding areas with the first layer 1 and the wiring conductors 4. The silicate phases 5 may also have bonding interfaces with the first layer 1 that are likely to be oblique (may be orthogonal) to a direction parallel to the interface between the first layer 1 and the wiring conductor 4. The bonding strength between the first layer 1 (insulating substrate 3) and the wiring conductor 4 is effectively improved against stress such as thermal stress acting in the direction parallel to the interface between the first layer 1 and the wiring conductor 4.

The silicate phases 5 may constitute, for example, about 10 to 40% of the interface area between the first layer 1 and the wiring conductor 4 when viewed in the sectional area shown in FIG. 2. The ratio of the silicate phases 5 may be measured in the manner described below. A cross-sectional sample of the interface area between the first layer 1 and the wiring conductor 4 is prepared first. The sample is then observed with, for example, a scanning electron microscope (SEM), and the silicate phases 5 undergo elemental analysis by X-ray diffraction (XRD). The above ratio can be measured in this manner.

The silicate phases 5 may be spherical or ellipsoidal, or spherical with partly irregular surfaces, rather than having irregular shapes. The silicate phases 5 may have different shapes. Some silicate phases (particles) 5 may have particle diameters different from other silicate phases 5, or all the silicate phases 5 may have substantially the same particle diameter. The particle diameter of each silicate phase 5 with an irregular shape may be determined as, for example, the largest distance across the cross section.

The wiring conductor 4 defining the above interface area may be fabricated, for example, in the manner described below. A powder of metal material containing at least either manganese or molybdenum is kneaded with an organic solvent and a binder to prepare a metal paste. The metal paste is then printed on the first layer 1 or a surface of the ceramic green sheet to be the first layer 1 in a predetermined pattern by, for example, screen printing. The metal paste is then fired at a predetermined temperature and fixed on the first layer 1 or co-fired with the first layer 1. The above processes complete the wiring conductor 4 in the insulating substrate 3 including the first layer 1.

During the firing, manganese in the metal paste and silica in the first layer 1 or the ceramic green sheet react with each other in the interface area between the metal paste and the first layer 1 or the ceramic green sheet, forming manganese silicate. The manganese silicate crystallizes to form the silicate phases 5 (crystal of manganese silicate).

A powder of magnesium, for example, may be added to the metal paste to form magnesium silicate crystals in the interface area between the wiring conductor 4 and the first layer 1. This forms silicate phases 5 including magnesium silicate phases. A metal paste containing both manganese and magnesium may form silicate phases 5 including manganese silicate phases and manganese silicate phases in the interface area between the first layer 1 and the wiring conductor 4.

In the above processes, the conditions including the molybdenum content or the magnesium content in the metal paste, the firing temperature, and the silica content in the first layer 1 or the ceramic green sheet may be appropriately adjusted to control the ratio of the silicate phases 5 in the interface area between the first layer 1 and the wiring conductor 4.

Electronic Device Package

As described above, the electronic device package 20 basically includes the wiring board 10 with the above structure and the metal housing 11 having the recess 11a and an opening 11b in a side wall of the recess 11a. In the electronic device package 20, the wiring board 11 is bonded to the metal housing 11 to close the opening 11b. The wiring board 10 serves as a part of a conductive path for electrically connecting the electronic component 21 received in the recess 11a to an external electric circuit. The wiring board 10 also serves as a sealant closing the opening 11b in the metal housing 11. More specifically, the wiring board 10 serves as an input-output terminal for electric signals in the electronic device package 20, which may be used for optical communications. FIG. 1 or other figures show the wiring board 10 closing the opening 11b.

The wiring board 10 and the metal housing 11 may be bonded with tin-silver solder or a brazing material such as a gold-tin brazing material. In this case, the insulating substrate 3 may include metal layers in portions to be bonded with the metal housing 11. The metal layers may be metallized layers 6 shown in FIG. 1. The metallized layers 6 will be described in detail later.

The metal housing 11 is formed from a metal material including an iron-based alloy such as an iron-nickel-cobalt alloy or stainless steel, or copper or a copper-based alloy. The metal housing 11 may include a frame integral with a bottom of the recess 11a or may include a separate frame bonded to the bottom. The metal housing 11 may be fabricated by processing the above metal material through metalworking processes appropriately selected from, for example, cutting, gliding, and polishing. The separate frame may be bonded integrally to the bottom with, for example, a brazing material such as a silver brazing material.

In the present embodiment, the metal housing 11 has a through-hole 11c in a portion of the frame. The through-hole 11c extends through the frame from its inner to outer surfaces. For example, the through-hole 11c serves as a space for receiving a member optically connecting the inside and the outside of the recess 11a. An optical fiber (not shown) may be placed through the through-hole 11c to allow transmission and reception of optical signals through the recess 11a.

In this case, for example, an optical signal is transmitted through the optical fiber to the electronic component 21, which converts the received optical signal into an electric signal. The electric signal is transmitted to an external electric circuit through the wiring board 10 in the manner described above. The electric signal and the optical signal may be transmitted in an order reverse to the above order. A holder for holding an optical fiber, such as a ferrule, may be placed through the through-hole 11c to close the opening in the recess 11a together with the wiring board 10 and a lid 23 (described later) to hermetically seal the electronic component 21 inside the recess 11a.

The electronic device package 20 including the wiring board 10 with the above structure facilitates fabrication of the electronic device 30 suitable for high-frequency signal transmission. The electronic device package 20 also reduces cracks or other defects in the wiring board 10, and facilitates fabrication of the electronic device 30 with higher reliability.

Electronic Device

The electronic device 30 basically includes the electronic device package 20 with the above structure and the electronic component 21 received in the recess 11a in the metal housing 11. The electronic component 21 is, for example, a photoelectric converter as described above. In the electronic device 30 according to the embodiment, the electronic component 21 is electrically connected to the wiring conductors 4 with bonding wires 22. In the example shown in FIG. 4, the lid 23 is bonded to an upper surface of the metal housing 11 to close the recess 11a. The recess 11a in the metal housing 11, the lid 23, and the wiring board 10 define a housing (with no reference numeral) that hermetically seals the electronic component 21. In the example shown in FIG. 4, the electronic component 21 is bonded to a bottom surface of the recess 11a in the housing 11 with a submount 24. The submount 24 is formed from, for example, sintered aluminum oxide, and fixes the electronic component 21 at a predetermined level from the bottom surface of the recess 11a. The submount 24 also serves as a heat transfer member between the electronic component 21 and the housing 11.

The electronic device 30 including the electronic device package 20 with the above structure allows high-frequency signal transmission and improves reliability. More specifically, the wiring conductors 4 transmitting a high-frequency signal, for example, a signal with a frequency higher than 40 GHz are simply in contact with the first layer 1 having a relatively smaller relative dielectric constant, or are exposed to a gas such as air in the recess 11a. This structure reduces delays in signal transmission through the wiring conductors 4. The insulating substrate 3 and the wiring conductors 4 are reliably bonded with at least either the manganese silicate phases or the magnesium silicate phases in the interface areas between the insulating substrate 3 and the wiring conductors 4. This structure effectively reduces cracks or other defects in the insulating substrate 3 and improves the reliability.

Other Structures and Modifications

The wiring board 10 includes the first layer 1 and the second layer 2 that are, for example, rectangular in a plan view as shown in FIG. 3. The first layer 1 includes extensions 1c outward from the opposing two sides of the second layer 2. The extensions 1c extend outward (in directions opposite to the second layer 2) from imaginary lines (two-dot chain lines) T in FIG. 1.

Parts of the wiring conductors 4 extend on the upper surface 1a of each extension 1c of the first layer 1. In the example shown in FIG. 1, the extensions 1c are parts of the first layer 1 in the thickness direction. The wiring conductors 4 extend on the same plane from the upper surface 1a of each extension 1c of the first layer 1 toward an inner portion of the first layer 1 between the upper and lower second layers 2.

More specifically, the wiring conductors 4 extend from inside and are partly exposed outside the first layer 1, and have these exposed portions supported on the extensions 1c of the first layer 1. In other words, the first layer 1 has two ends with a smaller thickness than other parts to uncover the ends of the wiring conductors 4. The extensions 1c may have any length (the dimension in which the wiring conductors 4 extend) depending on various conditions including the bonding of the bonding wires 22 on the wiring conductors 4 (described later), the mechanical strength of the extensions 1c, and the desirable outer dimensions of the wiring board 10.

The extensions 1c in this example face each other with a part of the frame surrounding the recess 11a in the housing 11 of the electronic device package 20 between them. More specifically, the extensions 1c are located inside and outside the recess 11a. This structure facilitates electrical connection of the wiring conductors 4 to an external electric circuit at the externally exposed ends on the extension 1c with a conductive bonding material (not shown) such as solder, and electrical connection of the electronic component 21 to the wiring conductors 4 (at the exposed ends) with, for example, the bonding wires 22. The resulting electronic device package 20 has reliable electrical connectivity of the electronic component 21 to the wiring board 10 and high productivity.

The above advantageous effects can be obtained with the structure having the extension 1c of the first layer 1 outward from at least one of the opposing two sides of the second layer 2 (in other words, both inside and outside the recess 11a). In this case, parts of the wiring conductors 4 extend on at least either the upper surface 1a or the lower surface 1b of the extension 1c of the first layer 1. The extended portions of the wiring conductors 4 can be easily connected to the electronic component 21 or an external electric circuit with a conductive bonding material, such as the bonding wires 22 or solder.

As shown in FIG. 3, the wiring conductors 4 entirely located on the same plane have no bent portions, and thus effectively reduce loss such as reflection loss. This structure effectively reduces transmission delays, and improves the transmission characteristics of high-frequency signals.

Figure 5:
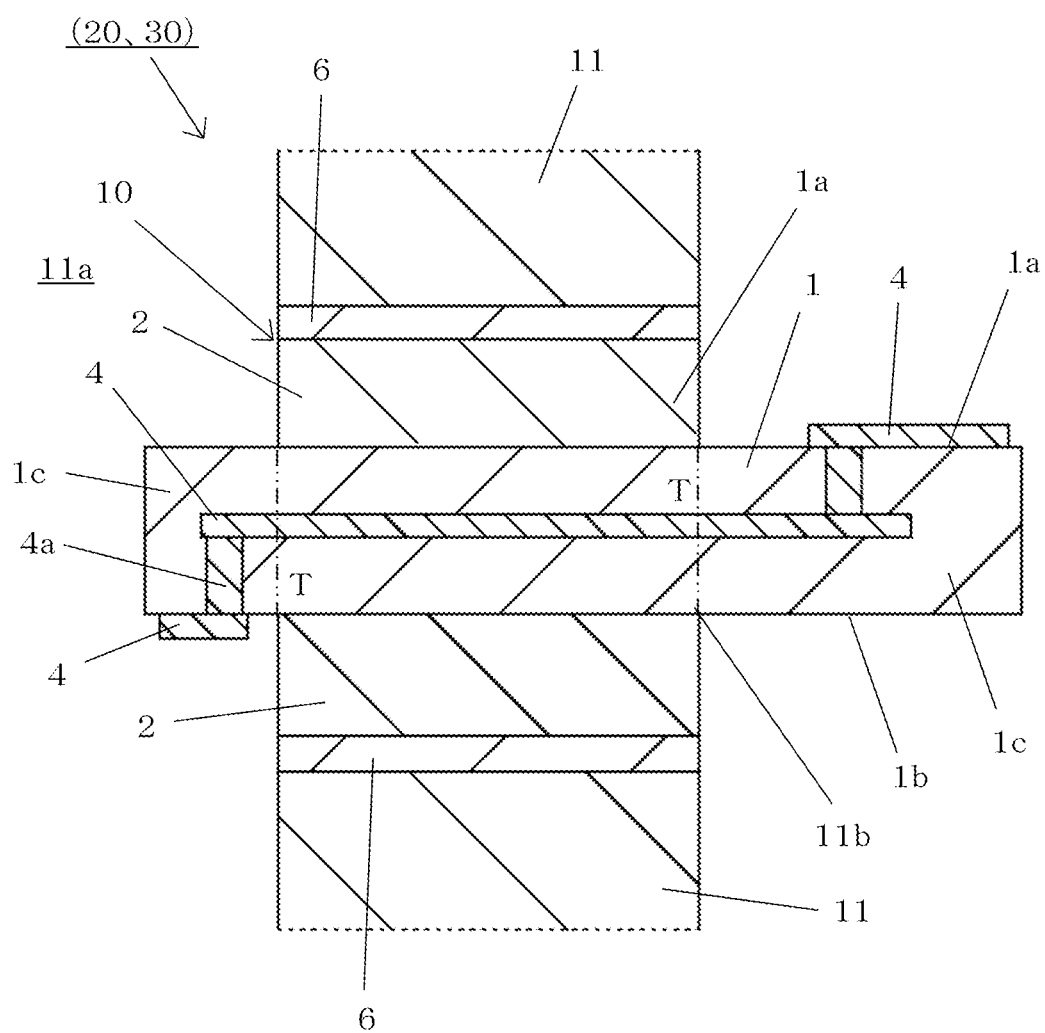
FIG. 5 is a cross-sectional view of a wiring board according to a modification of the wiring board shown in FIG. 1.

To facilitate connection between the wiring conductors 4 and an external device or the electronic component 21, the entire wiring conductors 4 may not be located on the same plane. For example, in the example shown in FIG. 5, the first layer 1 has a uniform thickness and extends outward from the second layer 2 at the opposing two sides. FIG. 5 is a cross-sectional view of a wiring board according to a modification of the wiring board shown in FIG. 1. In FIG. 5, the same components as in FIG. 1 are given the same reference numerals.

In the example shown in FIG. 5, the wiring conductors 4 each have one end on the upper surface 1a of the first layer 1 and the other end on the lower surface 1b of the first layer 1. The two ends are on the extensions 1c of the first layer 1. More specifically, one end of the wiring conductor 4 on the upper surface 1a and the other end of the wiring conductor 4 on the lower surface of the first layer 1 are exposed, without being covered by the second layer 2. The ends of the wiring conductor 4 are thus easily connectable to an external device or the electronic component 21. The ends of the wiring conductor 4 are electrically connected to an internal portion of the wiring conductor 4 located inside the first layer 1 through via conductors 4a inside the first layer 1.

The wiring board 10 with the above structure and the electronic device package 20 and the electronic device 30 including the wiring board 10 may include the second layer 2 formed from sintered aluminum oxide. More specifically, the second layer 2 may not contain mullite. This structure effectively increases the mechanical strength of the second layer 2, and increases the mechanical strength of the insulating substrate 3. This increases the mechanical strength and the reliability of the wiring board 10, the electronic device package 20, and the electronic device 30.

The second layer 2 formed from sintered aluminum oxide may be collectively fired with a ceramic green sheet containing mullite, which is to be the first layer 1, to fabricate the insulating substrate 3. The wiring conductors 4 and the first layer 1 may also be co-fired.

The wiring board 10, the electronic device package 20, and the electronic device 30 according to the embodiment include metal layers (metallized layers 6) on the second layers 2 as described above. The metallized layers 6 are located on the surfaces of the second layers 2 opposite to surfaces in contact with the first layers 1. More specifically, the metallized layers 6 are located on the upper surface of the upper second layer 2 and on the lower surface of the lower second layer 2. The metallized layers 6 serve as, for example, metal underlayers for bonding the metal housing 11 with a brazing material.

Figure 6:
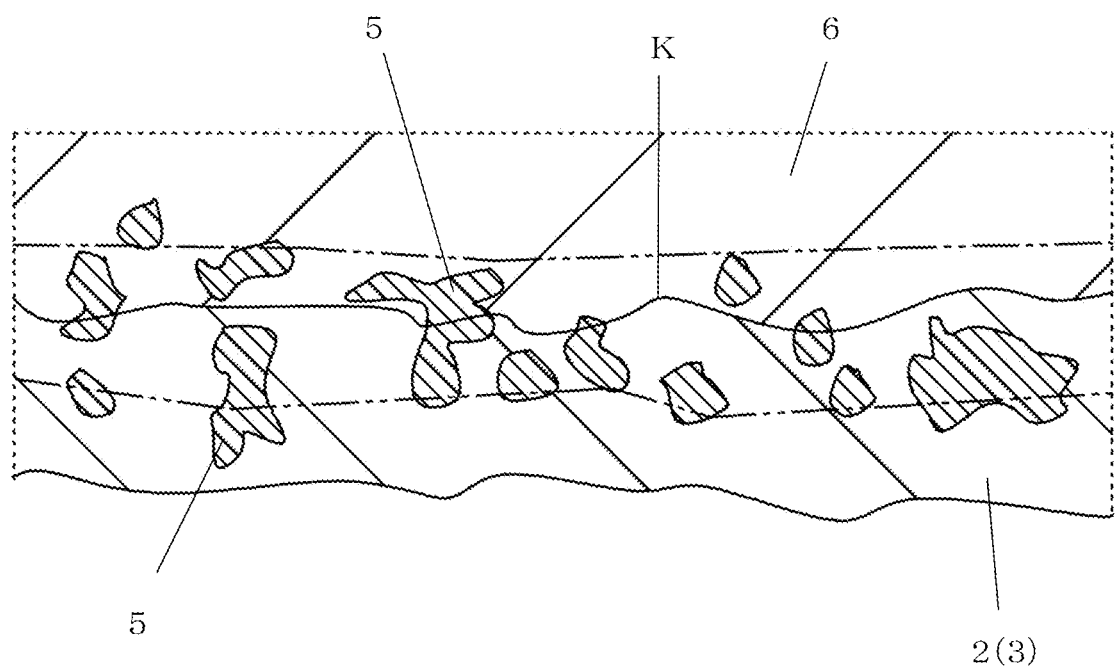
FIG. 6 is an enlarged cross-sectional view of part B in FIG. 1.

The metallized layers 6 contain at least either a manganese compound or a molybdenum compound. As shown in FIG. 6, for example, at least either the manganese silicate phases or the magnesium silicate phases (silicate phases 5) are located in the interface area between the insulating substrate 3 (second layer 2) and the metallized layer 6. FIG. 6 is an enlarged cross-sectional view of part B in FIG. 1. In FIG. 6, the same components as in FIG. 1 are given the same reference numerals. A boundary K in FIG. 6 indicates a boundary between the second layer 2 and the metallized layer 6.

The silicate phases 5 firmly bond the metallized layers 6 and the insulating substrate 3. This structure effectively reduces separation of the metallized layers 6 from the insulating substrate 3 or cracks or other possible mechanical defects in the insulating substrate 3 although, for example, thermal stress results from a difference in coefficient of thermal expansion between the insulating substrate 3 and the metal housing 11. This structure effectively improves the reliability of the electronic device 30. The wiring board 10 and the electronic device package 20 may also easily have improved reliability.

The metallized layers 6 may be prepared using, for example, the same metal material as the wiring conductors 4 described above in the same manner as for the wiring conductors 4. In this case, the metallized layers 6 contain at least either a manganese compound or a molybdenum compound similarly to the wiring conductors 4, thus facilitating formation of the silicate phases 5 described above.

In the wiring board 10, the electronic device package 20, and the electronic device 30 according to the embodiment, the silicate phases 5, or more specifically, at least either the manganese silicate phases or the magnesium silicate phases may be located in portions of the first layer 1 in which the wiring conductors 4 are located and in portions of the second layer 2 on which the metallized layers 6 are located. More specifically, the wiring board 10 may include the silicate phases 5 in a portion of the insulating substrate 3 containing metal components such as the wiring conductors 4 and the metallized layers 6. This structure can effectively reduce mechanical breakage, such as cracks, in the insulating substrate 3.

Figure 7:
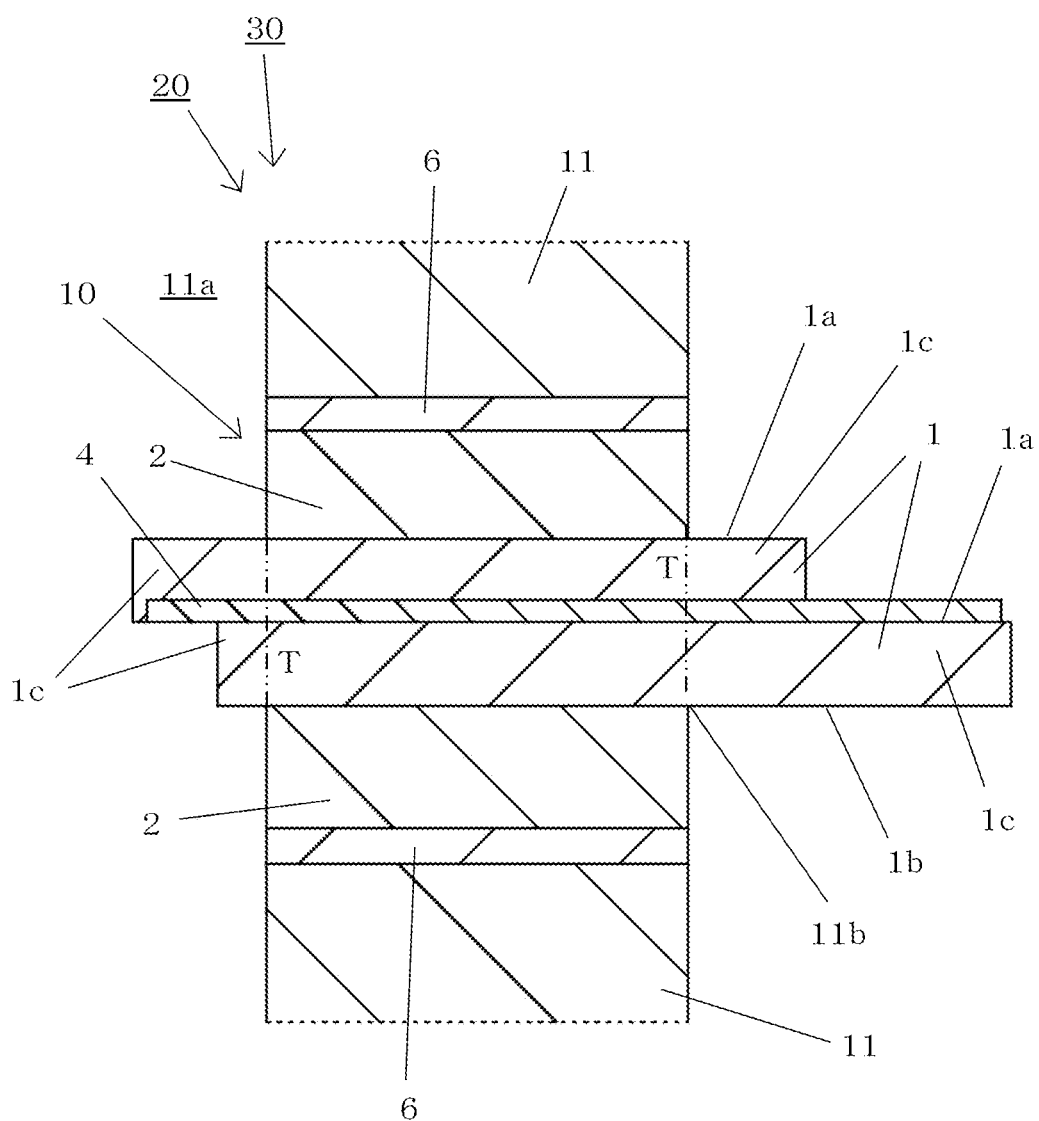
FIG. 7 is an enlarged cross-sectional view of a main part of an electronic device according to a modification of the electronic device shown in FIG. 3.
Figure 8:
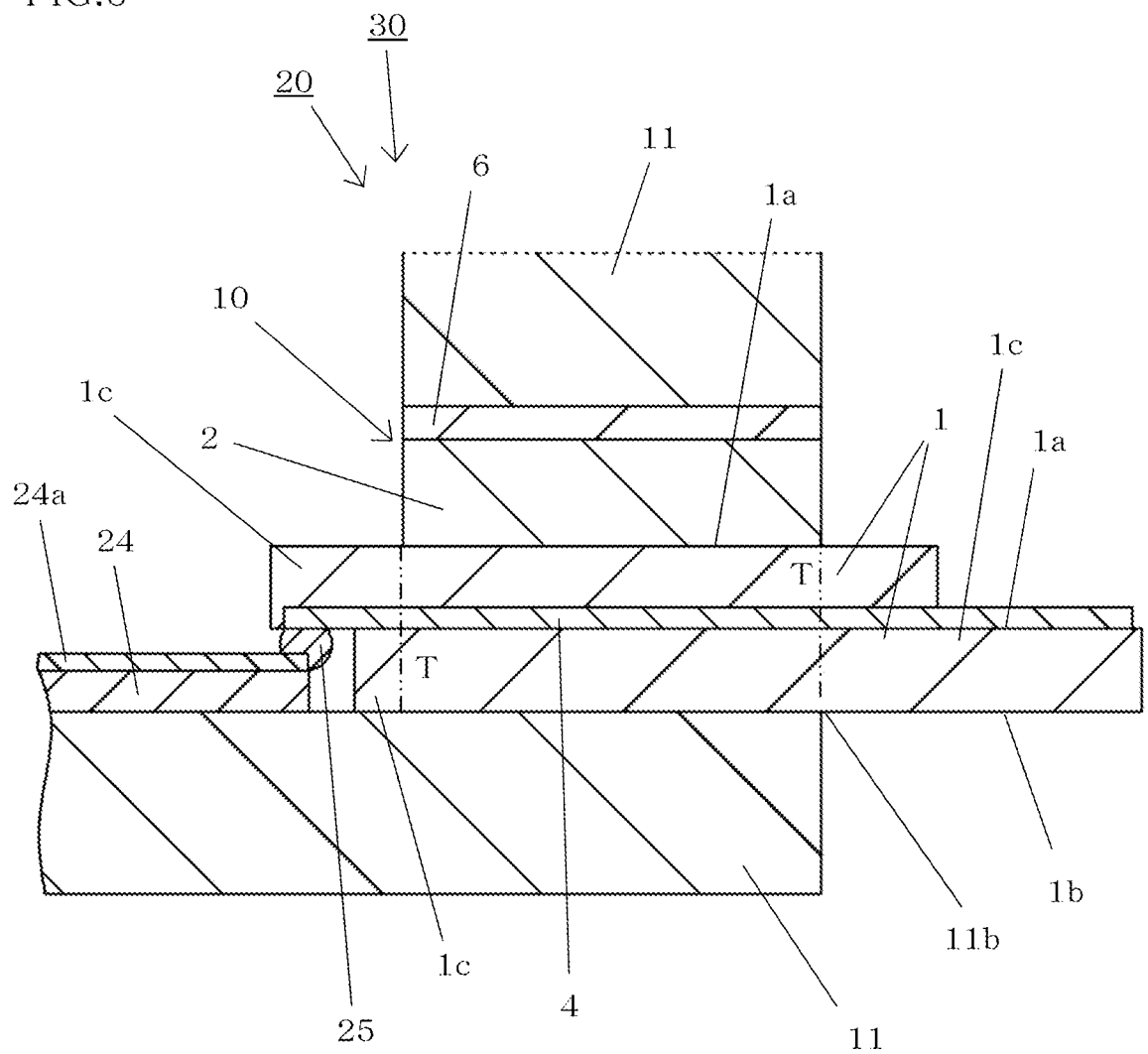
FIG. 8 is an enlarged cross-sectional view of a main part of an electronic device according to the modification of the electronic device shown in FIG. 3.

The structures according to the embodiments of the present invention are not limited to the structures described above, and may be modified variously within the scope of the present invention. FIGS. 7 and 8 are enlarged cross-sectional views of a main part of an electronic device according to a modification of the electronic device shown in FIG. 3. In FIGS. 7 and 8, the same components as in FIG. 3 are given the same reference numerals.

For example, in the example shown in FIG. 7, the first layer 1 has extensions 1c on its opposing two sides, with the wiring conductors 4 exposed on an upper surface of one extension 1c and on a lower surface of the other extension 1c. In this case, the wiring conductors 4 exposed on the lower surface of the first layer 1 can be easily electrically connected to the electronic component 21 with solder (e.g., solder balls). The wiring conductors 4 exposed on the upper surface of the first layer 1 can be easily electrically connected to an external electric circuit with, for example, lead terminals.

As shown in FIG. 8, the second layer 2 may simply be located on the upper surface 1a of the first layer 1. In this case as well, the wiring conductors 4 exposed on the lower surface 1b of the first layer 1 can be easily electrically connected to the electronic component 21 (or connection terminals 24a connected to the electronic component 21) (with no reference numeral) with solder 25. The wiring conductors 4 exposed on the upper surface 1a of the first layer 1 can also be easily electrically connected to an external electric circuit with, for example, lead terminals.

REFERENCE SIGNS LIST 1 first layer
1a upper surface
1b lower surface
1c extension
2 second layer
3 insulating substrate
4 wiring conductor
4a via conductor
5 silicate phase
6 metallized layer (metal layer)
10 wiring board
11 housing
11a recess
11b opening
11c through-hole
20 electronic device package
21 electronic component
22 bonding wire
23 lid
24 submount
24a connection terminal
25 solder
30 electronic device
K boundary
T imaginary line

The invention claimed is:

1. A wiring board, comprising:
an insulating substrate including a first layer and a second layer, the first layer having an upper surface and a lower surface and having a first content of aluminum oxide and containing mullite, the second layer stacked on the upper surface and/or the lower surface of the first layer and having a second content of aluminum oxide greater than the first content;
a wiring conductor located inside the first layer and containing a manganese compound and/or a molybdenum compound;
a manganese silicate phase and/or a magnesium silicate phase in an interface area between the insulating substrate and the wiring conductor;
a metal layer located on a surface of the second layer opposite to a surface in contact with the first layer and containing a manganese compound and/or a molybdenum compound; and
a manganese silicate phase and/or a magnesium silicate phase in an interface area between the insulating substrate and the metal layer.

2. The wiring board according to claim 1, wherein
the first layer and the second layer are rectangular in a plan view, the first layer includes an extension outward from at least one of opposing two sides of the second layer, and a part of the wiring conductor extends on the upper surface and/or the lower surface of the extension of the first layer.

3. The wiring board according to claim 2, wherein
the extension is a part of the first layer in a thickness direction, and the wiring conductor extends on the same plane from the upper surface or the lower surface of the extension of the first layer toward an inner portion of the first layer between the second layers on the upper surface and the lower surface of the first layer.

4. The wiring board according to claim 1, wherein the second layer comprises sintered aluminum oxide.

5. The wiring board according to claim 1, wherein the manganese silicate phase and/or the magnesium silicate phase is located in a portion of the first layer in which the wiring conductor is located and in a portion of the second layer on which the metal layer is located.

6. An electronic device package, comprising:
the wiring board according to claim 1; and
a metal housing having a recess and an opening in a side wall of the recess,
wherein the wiring board is bonded to the metal housing to close the opening.

7. An electronic device, comprising:
the electronic device package according to claim 6; and
an electronic component received in the recess in the metal housing.

8. A wiring board, comprising:
an insulating substrate including a first layer and a second layer, the first layer having an upper surface and a lower surface and having a first content of aluminum oxide and containing mullite, the second layer stacked on the upper surface and/or the lower surface of the first layer and having a second content of aluminum oxide greater than the first content;
a wiring conductor located inside the first layer;
a metal layer located on a surface of the second layer opposite to a surface in contact with the first layer and containing a manganese compound and/or a molybdenum compound; and
a manganese silicate phase and/or a magnesium silicate phase in an interface area between the insulating substrate and the metal layer.

9. The wiring board according to claim 8, wherein
the wiring conductor comprising a first portion located inside the first layer and a second portion exposed on the upper surface of the first layer.

10. The wiring board according to claim 8, wherein
a manganese silicate phase and/or a magnesium silicate phase is located in an interface area between the insulating substrate and the wiring conductor.

11. A wiring board, comprising:
an insulating substrate containing aluminum oxide as a main constituent and including a first layer and a second layer, the first layer having an upper surface and a lower surface and containing mullite, the second layer stacked on the upper surface and/or the lower surface of the first layer;
a wiring conductor comprising a first portion located inside the first layer and a second portion exposed on the upper surface of the first layer;
a metal layer located on a surface of the second layer opposite to a surface in contact with the first layer and containing a manganese compound and/or a molybdenum compound; and
a manganese silicate phase and/or a magnesium silicate phase in an interface area between the insulating substrate and the metal layer, and
wherein the first layer has a first relative dielectric constant and the second layer has a second relative dielectric constant greater than the first relative dielectric constant.

12. The wiring board according to claim 11, wherein
the first layer has a first content of aluminum oxide and contains mullite, and
the second layer has a second content of aluminum oxide greater than the first content.

13. The wiring board according to claim 11, wherein
the second layer doesn't contain mullite.

14. The wiring board according to claim 11, wherein
a manganese silicate phase and/or a magnesium silicate phase is located in an interface area between the insulating substrate and the wiring conductor.

* * * * *